(12) United States Patent
Singh

(10) Patent No.: US 12,074,211 B2
(45) Date of Patent: Aug. 27, 2024

(54) LATERAL BIPOLAR TRANSISTORS

(71) Applicant: GLOBALFOUNDRIES U.S. Inc., Malta, NY (US)

(72) Inventor: Jagar Singh, Clifton Park, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 157 days.

(21) Appl. No.: 17/872,790

(22) Filed: Jul. 25, 2022

(65) Prior Publication Data
US 2024/0030320 A1 Jan. 25, 2024

(51) Int. Cl.
*H01L 29/735* (2006.01)
*H01L 29/08* (2006.01)
*H01L 29/10* (2006.01)

(52) U.S. Cl.
CPC ........ *H01L 29/735* (2013.01); *H01L 29/0808* (2013.01); *H01L 29/0821* (2013.01); *H01L 29/1008* (2013.01)

(58) Field of Classification Search
CPC ............... H01L 29/735; H01L 29/0808; H01L 29/0821; H01L 29/1008; H01L 29/0649
See application file for complete search history.

(56) References Cited

U.S. PATENT DOCUMENTS

| | | |
|---|---|---|
| 6,940,149 B1 | 9/2005 | Divakaruni et al. |
| 7,897,995 B2 | 3/2011 | Yang et al. |
| 8,288,758 B2 | 10/2012 | Ning et al. |
| 9,536,788 B1 | 1/2017 | Ning et al. |
| 2008/0048296 A1 | 2/2008 | Lim |
| 2010/0289058 A1* | 11/2010 | Yang .................... H01L 21/8249 257/370 |
| 2013/0168819 A1* | 7/2013 | Chang ................. H01L 29/1004 257/E29.171 |
| 2015/0097265 A1* | 4/2015 | Lin ........................ H01L 29/735 438/335 |
| 2016/0099240 A1* | 4/2016 | Chen ................. H01L 29/66681 438/236 |
| 2019/0103367 A1* | 4/2019 | Chen ................. H01L 21/31053 |

OTHER PUBLICATIONS

Application and Drawings for U.S. Appl. No. 17/533,805, filed Nov. 23, 2021, 23 pages.
Yu et al., "Fin width and height dependence of bipolar amplification in bulk FinFETs submitted to heavy ion irradiation*", Chinese Physical Society and IOP Publishing Ltd., Oct. 12, 2015, Abstract, 2 pages.

* cited by examiner

*Primary Examiner* — Syed I Gheyas
(74) *Attorney, Agent, or Firm* — Andrew M. Calderon; Calderon Safran & Wright, PC

(57) ABSTRACT

The present disclosure relates to semiconductor structures and, more particularly, to bipolar transistors and methods of manufacture. The structure includes: an emitter in a semiconductor substrate; a collector in the semiconductor substrate; a base contact region in the semiconductor substrate and adjacent to the collector and the emitter; and a shallow trench isolation structure overlapping the base contact region and separating the base contact region from the emitter and the collector.

20 Claims, 5 Drawing Sheets

LATERAL BIPOLAR TRANSISTORS

BACKGROUND

The present disclosure relates to semiconductor structures and, more particularly, to bipolar transistors and methods of manufacture.

Bipolar transistors can be vertical transistors or lateral transistors. In a vertical bipolar transistor, carriers flow in a vertical direction. Since a collector region is formed in a position deep from a wafer surface, collector resistance increases, thus limiting the transistor performance especially for high-speed operation. In addition, the transistor requires a high-concentration buried layer, a collector epitaxial layer, and a deep trench isolation, etc. Consequently, the number of process steps increases and thus does the costs. On the other hand, the lateral bipolar transistor is simpler in structure than the vertical bipolar transistor.

SUMMARY

In an aspect of the disclosure, a structure comprises: an emitter in a semiconductor substrate; a collector in the semiconductor substrate; a base contact region in the semiconductor substrate and adjacent to the collector and the emitter; and a shallow trench isolation structure overlapping the base contact region and separating the base contact region from the emitter and the collector.

In an aspect of the disclosure, a structure comprises: an emitter in a semiconductor substrate; a collector in the semiconductor substrate; a gate structure between the emitter and the collector; a base contact region extending to an upper surface of the semiconductor substrate; and a shallow trench isolation structure overlapping the base contact region and isolating the base contact region from the emitter and the collector.

In an aspect of the disclosure, a method comprises: forming an emitter in a semiconductor substrate; forming a collector in the semiconductor substrate; forming a base contact region in the semiconductor substrate and adjacent to the collector and the emitter; and forming a shallow trench isolation structure overlapping the base contact region and separating the base contact region from the emitter and the collector.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to bipolar transistors and methods of manufacture. More specifically, the bipolar transistors comprise lateral bipolar transistors with a base contact region adjacent to and, in embodiments, extending under a shallow trench isolation structure. Advantageously, the lateral bipolar transistors exhibit low base resistance. In addition, the lateral bipolar transistors have a reduced number of fabrication steps, e.g., less masking processes, compared to conventional structures thereby providing cost effective fabrication processes.

In more specific embodiments, the lateral bipolar transistor includes a base contact region adjacent to a shallow trench isolation structure. The base contact region also extends under and below the shallow trench isolation structure. In this way, the base contact region exhibits a lower base resistance (Rb). Moreover, the base contact region may extend to a top surface of the semiconductor substrate. An emitter and collector may be provided adjacent the shallow trench isolation structure. More particularly, the emitter and collector may be provided between the shallow trench isolation structure and a gate structure. A deep N-well may be provided within the semiconductor substrate and underneath the base contact region. In embodiments, a shallow trench isolation structure may be provided in the semiconductor substrate, contacting to the deep N-well. The shallow trench isolation structure contacting the deep N-well may be used to provide isolation to the lateral bipolar transistor.

The lateral bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the lateral bipolar transistors of the present disclosure have been adopted from integrated circuit (IC) technology. For example, the structures are built on wafers and are realized in films of material patterned by photolithographic processes on the top of a wafer. In particular, the fabrication of the lateral bipolar transistors uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
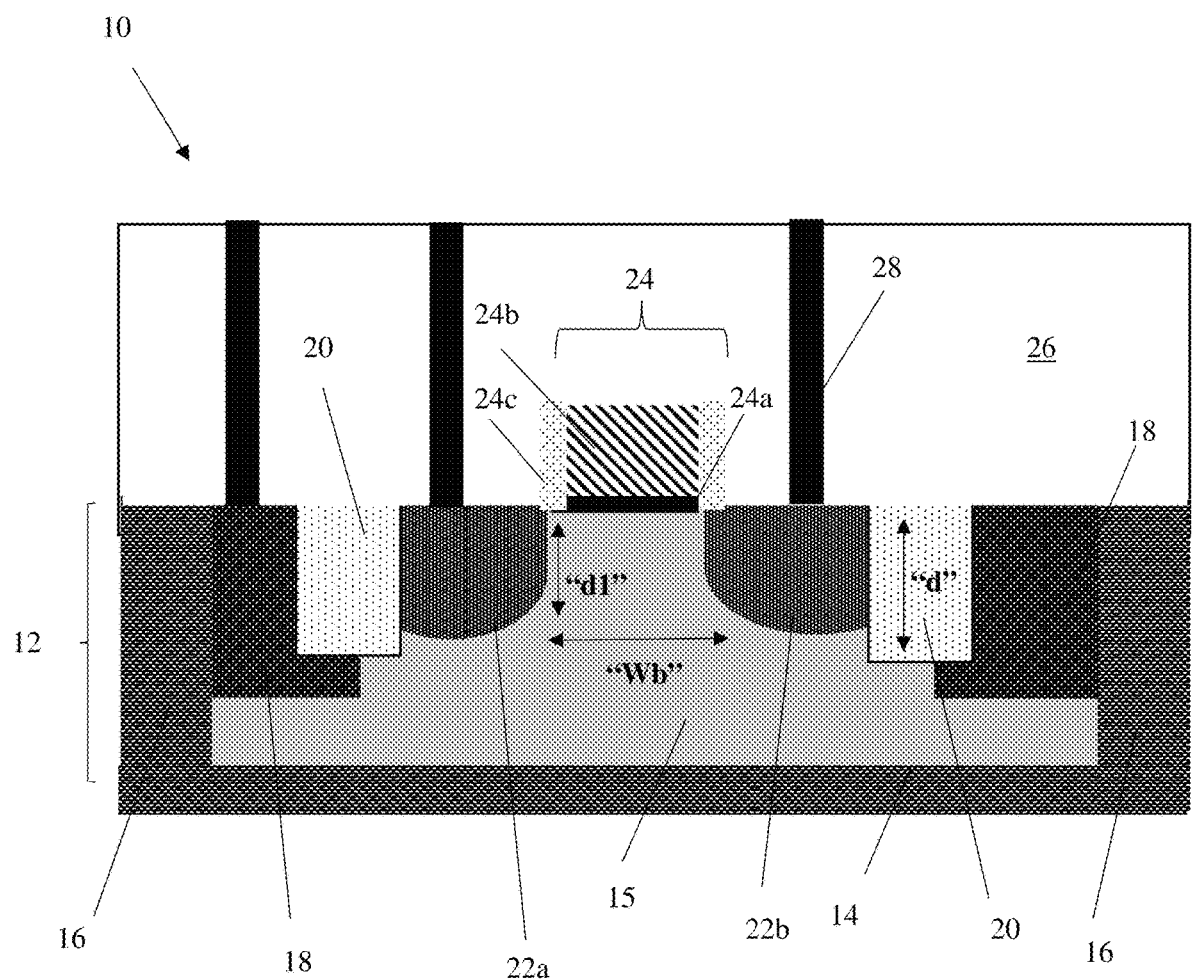
FIG. 1 shows a lateral bipolar transistor and methods of manufacture in accordance with aspects of the present disclosure.

FIG. 1 shows a lateral bipolar transistor and methods of manufacture in accordance with aspects of the present disclosure. More specifically, the structure 10 includes a semiconductor substrate 12. In embodiments, the semiconductor substrate 12 may be composed of any suitable material including, but not limited to, Si, SiGe, SiGeC, SiC, GaAs, InAs, InP, and other III/V or II/VI compound semiconductors. In preferred embodiments, the semiconductor substrate 12 comprises bulk material, e.g., bulk Si. The semiconductor substrate 12 may comprise any suitable crystallographic orientation (e.g., a (100), (110), (111), or (001) crystallographic orientation).

A deep N-well 14 may be provided in the semiconductor substrate 12 with N-wells 16 extending to the deep N-well 14. In embodiments, the deep N-well 14 and the N-wells 16 may be structured and located to isolate a P-well 15 within the semiconductor substrate 12. A base contact region 18 may be formed within the P-well 15 of the semiconductor substrate 12. The base contact region 18 may extend to a top surface of the semiconductor substrate 12. In embodiments, the base contact region 18 may be a P+ well formed by an ion implantation process as described in more detail with respect to FIG. 3A. Also, as should be understood by those of skill in the art, the deep N-well 14, N-wells 16 and P-well 15 may be formed using known implantation processes with known dopant types as described with respect to FIG. 3A.

Still referring to FIG. 1, a shallow trench isolation structure 20 may be formed within the semiconductor substrate 12, overlapping the base contact region 18 such that the base contact region 18 extends under the shallow trench isolation structure. In this way, the base contact region 18 exhibits a lower base resistance (Rb). In preferred embodiments, the shallow trench isolation structure(s) 20 may have a depth "d", which is shallower than the base contact region 18, i.e., the base contact region 18 is deeper than the shallow trench isolation structure(s) 20. For example and by way of non-limiting illustration, the shallow trench isolation structure(s) may have a depth of about 140 nm.

An emitter 22a and a collector 22b may be formed within the P-well 15 of the semiconductor substrate 12, on opposing sides of the shallow trench isolation structure 20 and a gate structure 24. In this way, the shallow trench isolation structure 20 may isolate the base contact region 18 from the emitter 22a and the collector 22b. Also, the deep N-well 14 and N-wells 16 may isolate the entire device. In embodiments, the emitter 22a and the collector 22b may be N+ wells formed by either an ion implantation process or, preferably, an epitaxial growth process with an in-situ n-type doping as discussed in more detail with respect to FIGS. 3C-3D. In preferred embodiments, the emitter 22a and the collector 22b may have a depth "d1" which is shallower than the depth "d" of the shallow trench isolation structure(s) 20. Also, as shown, the emitter 22a and the collector 22b are laterally spaced from the base contact region 18.

A gate structure 24 may be provided between the emitter 22a and the collector 22b. The width of the gate structure 24, e.g., Wb, may be less than 30 nm, in embodiments; although other dimensions are contemplated by the present disclosure depending on a particular technology node. In embodiments, the gate structure 24 may be a floating gate structure and, more specifically, a floating metal gate structure comprising a gate dielectric material 24a, a workfunction material 24b and sidewall spacers 24c.

The gate dielectric material 24a may be a low-k dielectric material or a high-k dielectric material. For example, the high-k dielectric material may be $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. Examples of the workfunction materials 24b may include Ti, TiAlC, Al, TiAl, TaN, TiN, TiC, Co, TaN, TaC, HfTi, TiSi or TaSi. The workfunction materials 24b and gate dielectric material 24a may be formed by chemical vapor deposition (CVD), physical vapor deposition (PVD) including sputtering, atomic layer deposition (ALD) or other suitable method as described in more detail with respect to FIGS. 3C and 3D. The sidewall spacers 24c may be an oxide and/or nitride material.

A dielectric material 26 may be formed over the gate structure 24, the base contact region 18, the emitter 22a and the collector 22b. In embodiments, the dielectric material 26 may comprise interlevel dielectric materials. For example, the dielectric material 26 may be a combination of nitride and/or oxide based materials, e.g., SiN and $SiO_2$. Contacts 28 are formed within the dielectric material 26, connecting to the base contact region 18, the emitter 22a and the collector 22b.

Figure 2:
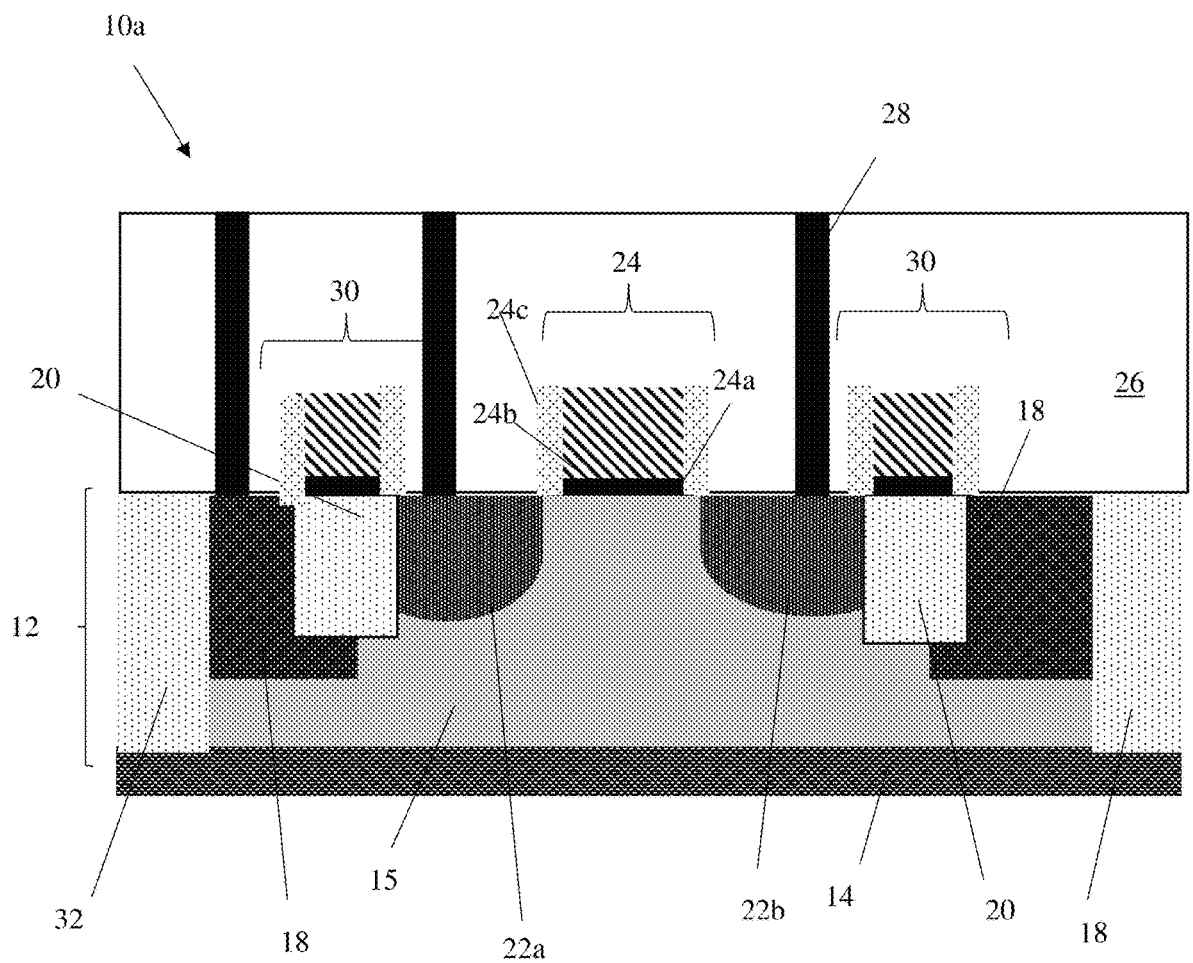
FIG. 2 shows a lateral bipolar transistor in accordance with additional aspects of the present disclosure.

FIG. 2 shows a lateral bipolar transistor in accordance with additional aspects of the present disclosure. In the structure 10a of FIG. 2, dummy gate structures 30 are formed on the shallow trench isolation structures 20. The dummy gate structures 30 may be used to prevent density mitigation issues, which will eliminate dishing of back end of line (BEOL) materials such as interlevel dielectric material. In addition, shallow trench isolation structures 32 may be adjacent to the base contact region 18 on opposing sides from the shallow trench isolation structures 20. In embodiments, the shallow trench isolation structures 32 may extend to the deep N-well 14 to isolate the device. The remaining features of the structure 10a of FIG. 2 may be similar to the structure 10 of FIG. 1 such that no further explanation is required for a complete understanding of the present disclosure.

Figure 3A:
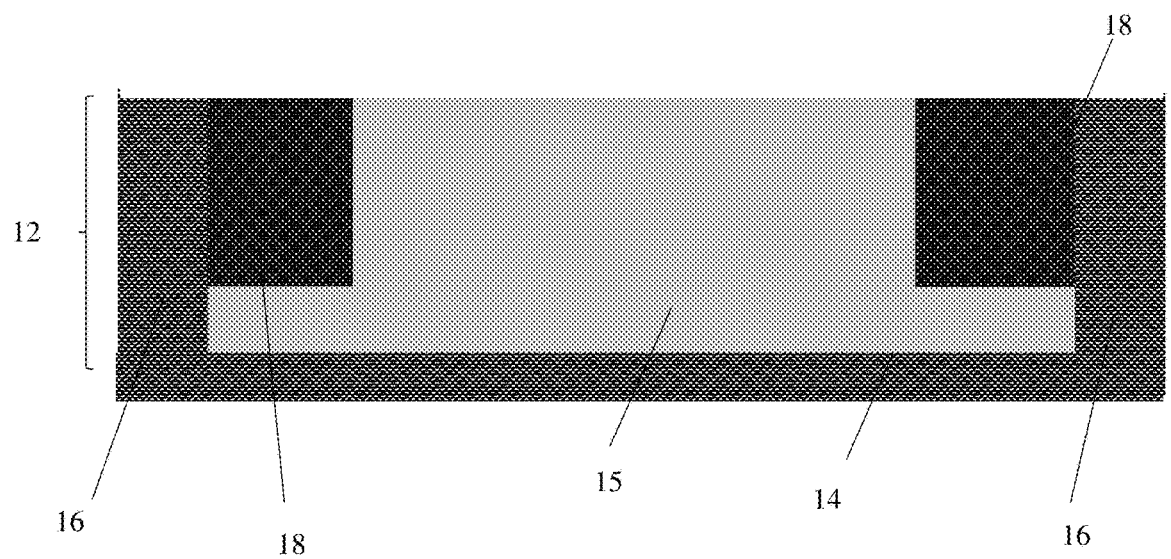
FIGS. 3A-3D show processing steps for fabricating the lateral bipolar transistor of FIG. 1 in accordance with aspects of the present disclosure.

FIGS. 3A-3D show processing steps for fabricating the lateral bipolar transistor 10 of FIG. 1. FIG. 3A shows the semiconductor substrate with the N-well 14, N-wells 16, P-well 15 and base contact region 18. The N-well 14, N-wells 16, P-well 15 and base contact region 18 may be formed by separate ion implantation processes. By way of example, the N-well 14, N-wells 16, P-well 15 and base contact region 18 may be formed by introducing a concentration of an N-type dopant or P-type dopant in the semiconductor substrate 12 using respective patterned implantation masks to define selected areas exposed for the implantation as is known in the art. The implantation masks may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The deep N-well 14 and N-wells 16 may be doped with n-type dopants, e.g., Arsenic (As), Phosphorus (P) and Sb, among other suitable examples at different concentrations; whereas the P-well 15 and base contact region 18 may be doped with p-type dopants, e.g., Boron (B) at different concentrations.

Figure 3B:
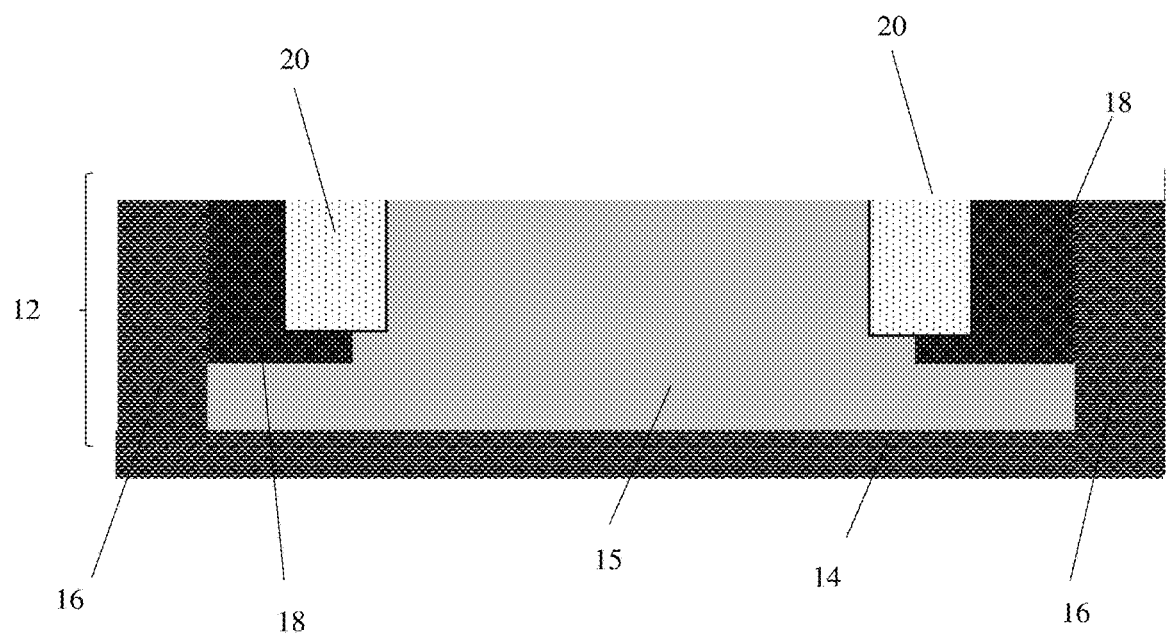

In FIG. 3B, the shallow trench isolation structure(s) 20 may be formed partially over the base contact region 18. In embodiments, the shallow trench isolation structure(s) 20 can be formed by conventional lithography, etching and deposition methods known to those of skill in the art. For example, a resist formed over the semiconductor substrate 12 is exposed to energy (light) and developed to form a pattern (opening) which partially overlaps with the base contact region 18. An etching process with a selective chemistry, e.g., reactive ion etching (RIE), will be used to transfer the pattern from the resist layer to the semiconductor substrate 12 to form one or more trenches in the semiconductor substrate 12, including partially extending with the base contact region 18. Following the resist removal by a conventional oxygen ashing process or other known stripants, insulator material (e.g., $SiO_2$) can be deposited by any conventional deposition processes, e.g., CVD processes. Any residual material on the surface of the semiconductor substrate 12 can be removed by conventional chemical mechanical polishing (CMP) processes.

Figure 3C:
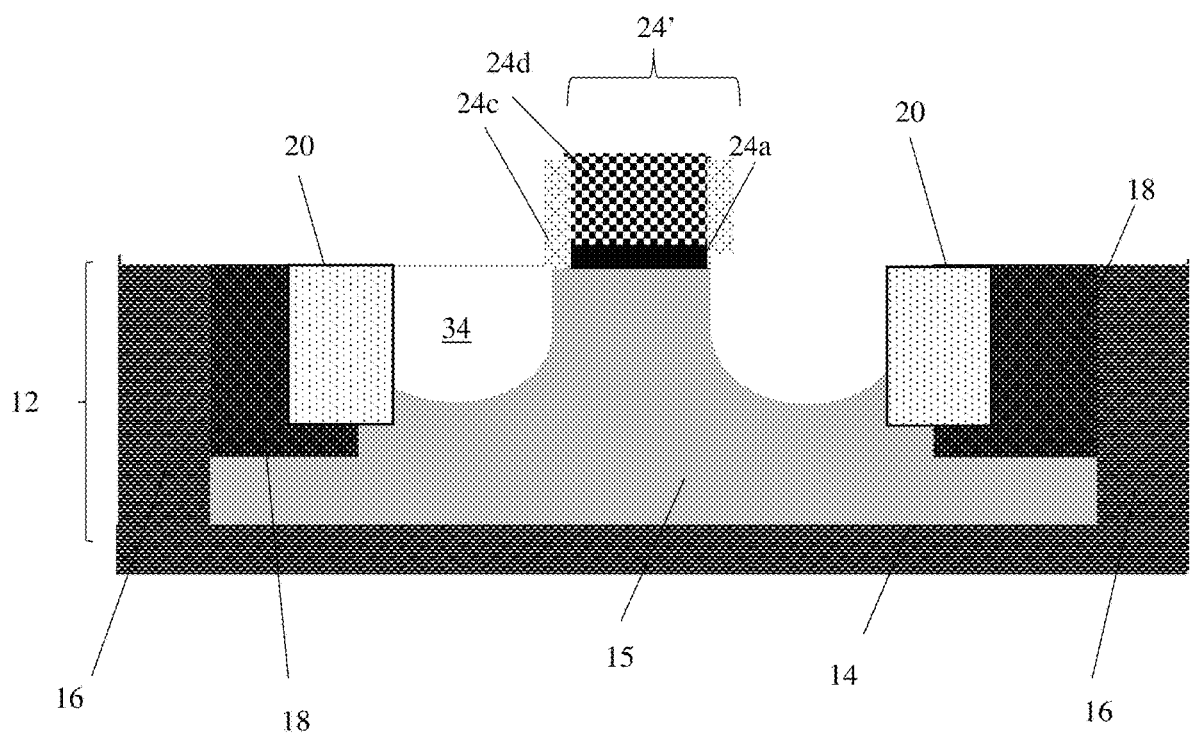

FIG. 3C shows formation of a dummy gate structure 24' and cavity structures 34 on sides of the dummy gate structure 24'. In embodiments, the dummy gate structure 24' may act as a mask for the formation of the cavity structures 34 as described herein. The dummy gate structure 24' comprises the gate dielectric material 24a, a polysilicon material (e.g., sacrificial material) 24d and the sidewall spacers 24c. The gate dielectric material 24a may be a low-k dielectric material or a high-k dielectric material as already described herein. The gate dielectric material 24a and polysilicon material 24d may be formed by conventional deposition processes, e.g., CVD, followed by a conventional patterning process, e.g., lithography and etching processes as described herein. The dummy gate structure 24' may also include sidewall spacers 24c fabricated using a conventional deposition process, e.g., blanket CVD, followed by an anisotropic etching process. The sidewall spacers 24c may be an oxide and/or nitride material.

After the dummy gate formation, a cavity structure 34 may be formed within the semiconductor substrate 12 on sides of the dummy gate structure 24' and adjacent to the shallow trench isolation structures 20. The cavity structures 34 may be formed by conventional lithography and etching processes with a selective chemistry to the semiconductor substrate 12. In embodiments, the dummy gate structure 24' may act as a mask during this selective etching process. Also, the cavity structures 34 have uniform profiles.

Figure 3D:
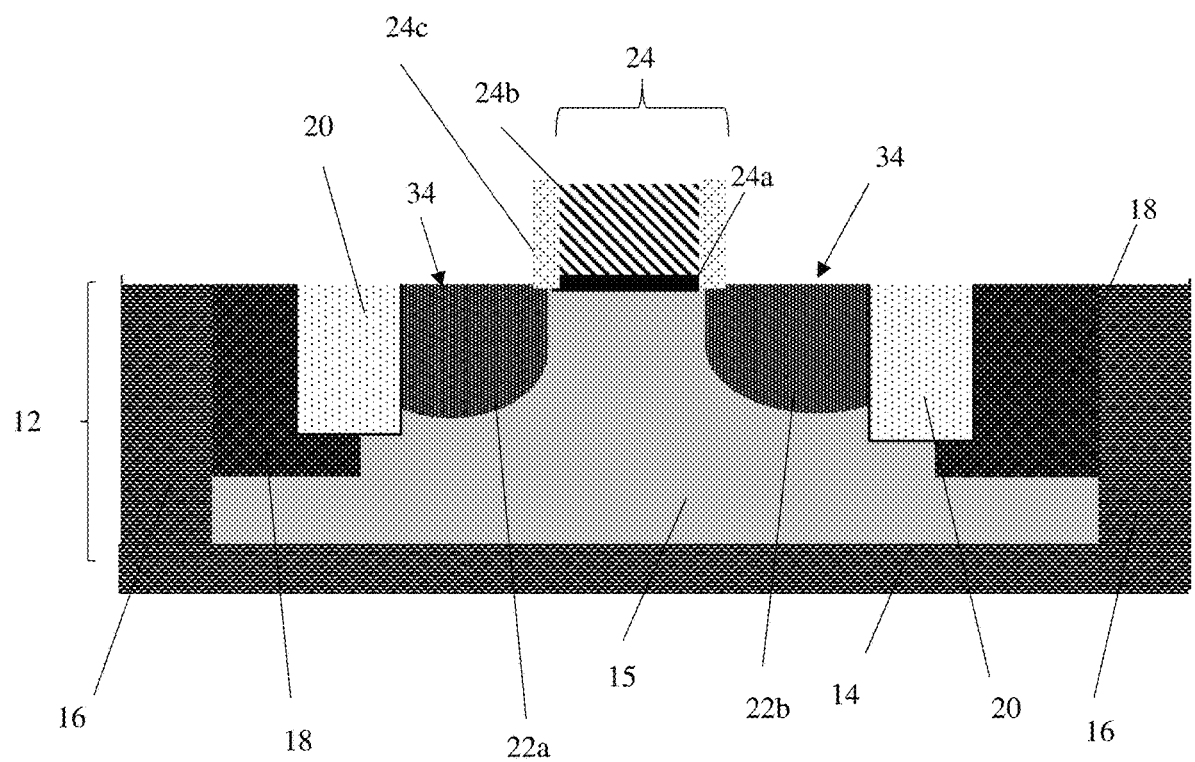

As shown in FIG. 3D, the cavity structures 34 may be filled with semiconductor material to form the emitter 22a and the collector 22b, between the gate structure 24 and the shallow trench isolation structures 20. In embodiments, the emitter 22a and the collector 22b may be semiconductor material epitaxially grown within the cavity structure 34. In more specific embodiments, the emitter 22a and the collector 34 may be epitaxially grown SiP. In this way, the emitter 22a and the collector 22b are N+ regions, laterally separated from the base contact region 18 by the shallow trench isolation structures 20.

The gate structure 24 may be formed using conventional replacement gate technologies. In a replacement gate process, for example, the sacrificial material, e.g., polysilicon material 24d, is removed between the sidewall spacers 24c, followed by deposition of replacement metal gate material. As noted herein, the metal gate material may be Ti, TiAlC, Al, TiAl, TaN, TiN, TiC, Co, TaC, HfTi, TiSi or TaSi, depending on whether the replacement gate structure 24 is an NFET or a PFET as is known in the art such that no further explanation is required for a complete understanding of the present disclosure.

Referring back to FIG. 1, the dielectric material 26 may be formed over the gate structure 24, the base contact region 18, the emitter 22a and the collector 22b. In embodiments, the dielectric material 26 may comprise a combination of nitride and/or oxide based materials, e.g., SiN and $SiO_2$, deposited using conventional deposition processes, e.g., CVD. Vias or trenches may be formed within the dielectric material 26 to expose the surfaces of the base contact region 18, the emitter 22a and the collector 22b.

The vias or trenches may be formed using conventional lithography and etching processes as described herein such that no further explanation is required for a complete understanding of the present disclosure.

The exposed surfaces of the base contact region 18, the emitter 22a and the collector 22b may undergo a silicide process to form silicide contacts on the exposed semiconductor material of the base contact region 18, the emitter 22a and the collector 22b. As should be understood by those of skill in the art, the silicide process begins with deposition of a thin transition metal layer, e.g., nickel, cobalt or titanium, over fully formed and patterned semiconductor material. After deposition of the material, the structure is heated allowing the transition metal to react with exposed silicon (or other semiconductor material as described herein) in the active regions of the semiconductor device (e.g., the base contact region 18, the emitter 22a and the collector 22b) forming a low-resistance transition metal silicide. Following the reaction, any remaining transition metal is removed by chemical etching, leaving silicide contacts in the active regions of the device. It should be understood by those of skill in the art that silicide contacts will not be required on the metal gate structure 24.

Contacts 28 are formed within the vias or trenches of dielectric material 26, connecting to the base contact region 18, the emitter 22a and the collector 22b. In more specific embodiments, the contacts 28 land on the silicide contacts of the base contact region 18, the emitter 22a and the collector 22b. The contacts may be tungsten, for example, lined with TaN or TiN. The contacts 28 may be deposited using conventional deposition process, e.g., CVD, followed by a CMP process to remove any excessive material on the surface of the dielectric material 26.

The lateral bipolar transistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   an emitter in a semiconductor substrate;
   a collector in the semiconductor substrate;
   a base contact region in the semiconductor substrate and adjacent to the collector and the emitter, wherein the collector and the emitter are between the base contact region; and
   a shallow trench isolation structure overlapping the base contact region and further separating the base contact region from the emitter and the collector.

2. The structure of claim 1, wherein the base contact region extends to an upper surface of the semiconductor substrate, wherein the collector, the emitter and the base contact region each comprise an outer side and an inner side, and the shallow trench isolation structure overlaps the inner side of the base contact region and the outer side of both the collector and the emitter.

3. The structure of claim 1, wherein the base contact region extends below and underneath the shallow trench isolation structure.

4. The structure of claim 3, wherein the shallow trench isolation structure is deeper into the semiconductor substrate than the emitter and the collector, the shallow trench isolation structure overlaps an outer side of both the emitter and the collector and an inner side of the base contact region such that the inner side of the base contact region extends past an outer side of the shallow trench isolation structure to contact an underside surface of the shallow trench isolation region.

5. The structure of claim 1, wherein the emitter and the collector comprise N+ regions and the base contact region comprises a P+ region.

6. The structure of claim 5, wherein the emitter, the collector and the base contact region are within a P-well isolated by a deep N-well and N-wells connecting to the deep N-well.

7. The structure of claim 6, wherein the deep N-well is under the base contact region.

8. The structure of claim 1, further comprising a floating gate structure sitting over a well between the base contact region, the emitter and the collector on opposing sides from the shallow trench isolation structure and the base contact region.

9. The structure of claim 8, wherein the floating gate structure comprises a replacement metal gate structure.

10. The structure of claim 1, further comprising an additional shallow trench isolation structure adjacent to the base contact region on an opposing side from the shallow trench isolation structure.

11. The structure of claim 1, further comprising gate structures on the shallow trench isolation structure adjacent to the emitter and the collector.

12. A structure comprising:
an emitter in a semiconductor substrate;
a collector in the semiconductor substrate;
a gate structure between the emitter and the collector;
a base contact region extending to an upper surface of the semiconductor substrate; and
a shallow trench isolation structure overlapping the base contact region and isolating the base contact region from the emitter and the collector,
wherein the emitter, the collector and the shallow trench isolation structure are confined between the base contact region.

13. The structure of claim 12, wherein the base contact region extends below the shallow trench isolation structure.

14. The structure of claim 13, wherein the shallow trench isolation structure is deeper into the semiconductor substrate than the emitter and the collector.

15. The structure of claim 12, wherein the emitter and the collector comprise N+ regions and the base contact region comprises a P+ region.

16. The structure of claim 15, further comprising a deep N-well under the base contact region.

17. The structure of claim 12, wherein the gate structure comprises a floating gate structure between the emitter and the collector.

18. The structure of claim 17, wherein the floating gate structure comprises a replacement metal gate structure.

19. The structure of claim 12, further comprising gate structures on the shallow trench isolation structure adjacent to the emitter and the collector.

20. A method comprising:
forming an emitter in a semiconductor substrate;
forming a collector in the semiconductor substrate;
forming a base contact region in the semiconductor substrate and adjacent to the collector and the emitter, wherein the collector and the emitter are between the base contact region; and
forming a shallow trench isolation structure overlapping the base contact region and separating the base contact region from the emitter and the collector.

* * * * *